(12) United States Patent
Loeffelholz et al.

(10) Patent No.: US 6,831,527 B2
(45) Date of Patent: Dec. 14, 2004

(54) INSERTION BOX

(75) Inventors: Todd Loeffelholz, Minnetonka, MN (US); Wayne DeBoef, Buffalo, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/322,354

(22) Filed: Dec. 17, 2002

(65) Prior Publication Data

US 2004/0113718 A1 Jun. 17, 2004

(51) Int. Cl.[7] ............................ H01P 5/12; H04N 5/38
(52) U.S. Cl. .................... 333/100; 333/131; 348/723; 455/3.1; 340/825.02; 725/149
(58) Field of Search ........................ 333/131, 119, 333/32, 100, 124–126, 129, 132, 134, 136; 340/825.02; 725/118, 127, 148, 149; 348/723; 455/3.1

(56) References Cited

U.S. PATENT DOCUMENTS

| | | | | |
|---|---|---|---|---|
| 4,275,365 A | * | 6/1981 | Ando ........................ | 333/131 |
| 4,905,239 A | * | 2/1990 | Lockwood et al. ......... | 370/497 |
| 5,229,729 A | * | 7/1993 | Nishikawa et al. ......... | 333/126 |
| 5,255,086 A | * | 10/1993 | McMullan et al. ......... | 725/131 |
| 5,812,220 A | | 9/1998 | Weiss et al. ................ | 348/723 |
| 5,901,340 A | | 5/1999 | Flickinger et al. .......... | 455/3.1 |
| 5,959,507 A | | 9/1999 | Gresko ...................... | 333/100 |
| 6,118,354 A | * | 9/2000 | Decramer et al. .......... | 333/131 |
| 6,144,399 A | * | 11/2000 | Manchester et al. ........ | 725/127 |
| 2002/0109560 A1 | | 8/2002 | Loeffelholz et al. ........ | 333/100 |

FOREIGN PATENT DOCUMENTS

WO    WO 00/78013 A1    12/2000

OTHER PUBLICATIONS

"SCN–Manager™ RF Signal Management," *PCI Technologies Inc.*, 5 pages Jan., 2003.

* cited by examiner

Primary Examiner—Barbara Summons
(74) Attorney, Agent, or Firm—Merchant & Gould P.C.

(57) ABSTRACT

An insertion box provides a plurality of input and output ports. Each input port corresponds with a predefined and unchanging set of output ports. Insertion of a signal into a particular input port results in that signal being delivered to each of the corresponding output ports. The dissemination functionality is performed by RF circuitry that is typically housed within the insertion box, and is interposed between the input ports and the output ports. The RF circuitry is composed of combiner circuits and splitter circuits. The RF circuitry is designed so that when a combiner is used as an input stage for a splitter, a transformer, usually used to convert an input or output impedance to match a characteristic line impedance, is eliminated. Elimination of such a transformer results in a concomitant reduction in signal loss.

24 Claims, 7 Drawing Sheets

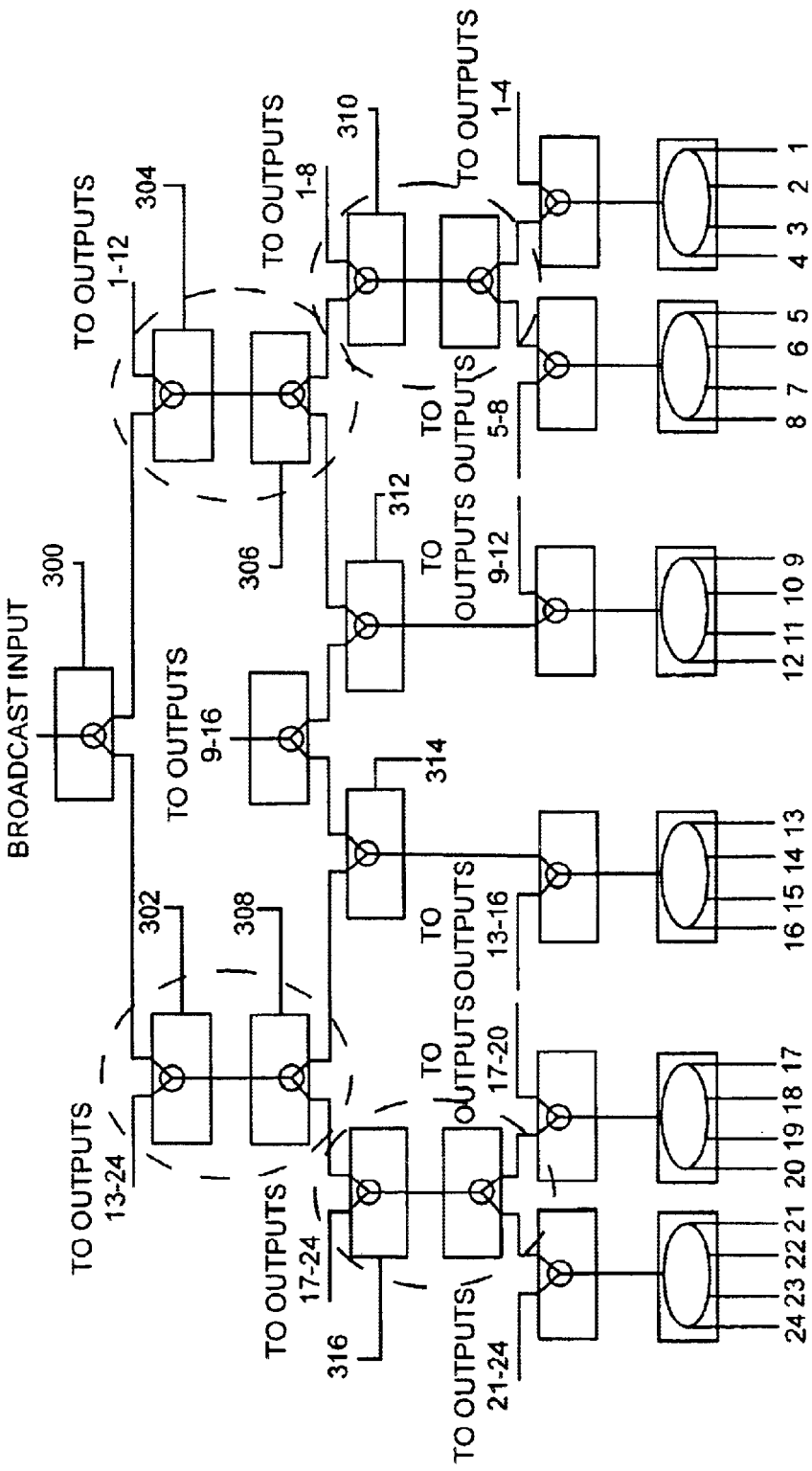

INSERTION BOX

TECHNICAL FIELD

The present invention relates to an insertion box used in dissemination of radio frequency (RF) signals, such as might be performed by a cable television routing station. The present invention relates more particularly to an insertion box utilizing RF splitting and combining circuitry exhibiting low loss levels.

BACKGROUND

A cable television routing station receives a plurality of television signals, and directs an appropriate subset of those signals to cable television networking equipment in various communities. Ultimately, the signals are transmitted from the networking equipment in the various communities to subscribers. The task of disseminating the RF signals (television signals) to appropriate communities is typically accomplished by feeding each of the available RF signals to discrete combining and splitting modules, which are strung together to achieve a desired set of resulting outputs, each of which has an appropriate subset of television signals.

FIG. 1 illustrates the functionality of a simple cable television routing station. The routing station 100 receives three signals (channels 4, 5, and 6) and serves two communities (communities A and B). An actual cable television routing station would receive many more signals and serve many more communities. Per this simplified example, community A is to receive channels 4 and 6, while community B is to receive channels 4 and 5. To accomplish this dissemination task, the routing station 100 may employ a splitting module 102 and two combining modules 104 and 106. Splitting module 102 receives channel 4 and splits the RF signal, delivering channel 4 to each of combiners 104 and 106. In addition to receiving channel 4 as an input, combiner 104 also receives channel 6. Combiner 104 combines the signals received at its input, yielding channels 4 and 6 at its output. The output of combiner 104 is directed to network equipment that serves community A. Similarly, combiner 106 receives channels 4 and 5 as inputs, and combines those signals. The output of combiner 106 is directed to network equipment that serves community B.

Ordinarily, the combiners and splitters (such as splitter 102 and combiners 104 and 106) at a routing station are embodied as individual modules, which are housed in racks. Coaxial cables are used to route signals to and from the individual modules. Thus, desired splitting and combining functionality is accomplished via interconnecting individual splitting and combining modules with RF cables.

The foregoing practice exhibits certain shortcomings. A great number of individual splitting and combining modules are necessary to provide desired dissemination functionality for a routing station. Accordingly, these modules consume a considerable amount of space. Further, each time a signal is directed through a splitter or combiner module, a certain loss is incurred.

As the foregoing makes evident, there exists a need for a scheme by which RF signals may be disseminated while making use of a minimal number of individual splitting and combining modules, and while introducing a minimal amount of signal loss.

SUMMARY OF THE INVENTION

Against this backdrop, the present invention was developed. An insertion box solving the aforementioned problems may include a plurality of output ports. Each output port may be coupled to an output line that exhibits a characteristic impedance. The insertion box may also include a plurality of input ports. Each input port may also be coupled to an input line that exhibits the aforementioned characteristic impedance. Each input port corresponds with a predefined and unchanging set of output ports, so that a radio frequency (RF) signal conducted to a particular input port is conducted from the corresponding set of output ports. An RF circuit is interposed between the input ports and the output ports. The RF circuit effects the correspondence between input ports and output ports. The RF circuit includes splitter circuits and combiner circuits. At least one splitter circuit exhibits an input impedance less than the aforementioned characteristic impedance. Also, at least one combiner circuit exhibits an output impedance less than the aforementioned characteristic impedance.

According to another embodiment of the present invention, an RF circuit may include a combiner-splitter pair, which may itself include a first transformer having a first winding and a second winding. Each winding may have an input end and an output end. The output ends of the first and second windings are joined, creating a combiner output. The combiner-splitter pair may also include a second transformer having a third winding and a fourth winding. Each winding may have an input end and an output end. The input ends of the third and fourth windings are joined, creating a splitter input. The splitter input is attached to the combiner output.

According to yet another embodiment of the present invention, a method of disseminating a plurality of RF signals from a plurality of input lines to a plurality of output lines may include receiving, from one of the plurality of input lines, a first signal. The first signal may be split along first and second conduction paths. The signal propagating along the first conduction path may be received and combined with a second signal, yielding an output signal delivered from a combiner exhibiting an output impedance that is one-half of its input impedance. The output signal may be split, yielding a split output signal delivered from a splitter exhibiting an output impedance that is twice its input impedance. The split output signal may be disseminated to a plurality of output lines.

According to yet another embodiment of the present invention, an insertion box may include a plurality of output ports. Each output port may be coupled to an output line that exhibits a characteristic impedance. The insertion box may also include a plurality of input ports. Each input port may be coupled to an input line that exhibits the aforementioned characteristic impedance. Each input port corresponds with a set of output ports, so that a radio frequency (RF) signal conducted to a particular input port is conducted from the corresponding set of output ports. An RF circuit is interposed between the input ports and the output ports. The RF circuit effects said correspondence between input ports and output ports. The RF circuit comprises a means for combining and splitting RF signals without using a magnetic core to convert an output impedance of the means for combining to match an input impedance of the means for splitting.

BRIEF DESCRIPTION OF THE FIGURES

FIG. 3 depicts an exemplary circuit schematic that may be housed in an insertion box to effect correspondence between input ports and output ports.

DETAILED DESCRIPTION

The following scheme provides for dissemination of RF signals by use of an insertion box exhibiting minimal loss characteristics. An insertion box provides a plurality of input and output ports. An insertion box with n output ports is referred to as an "n node insertion box." Each input port corresponds with a predefined and unchanging set of output ports. Insertion of a signal into a particular input port results in that signal being delivered to each of the corresponding output ports. For example, if a first input port corresponds to output ports 1 through 4, then insertion of a first signal into the first input port results in that signal being delivered from each of output ports 1 through 4. If a second input port corresponds to output ports 1 and 2, then insertion of a second signal into the second input port results in the second signal being delivered from output ports 1 and 2 (as well as the first signal being delivered therefrom). Thus, a particular dissemination pattern may be chosen simply by choosing which input port to deliver a particular signal to.

The dissemination functionality described above is performed by RF circuitry that is typically housed within the insertion box, and is interposed between the input ports and the output ports. The RF circuitry is composed of combiner circuits and splitter circuits. A combiner circuit typically includes two magnetic cores. A first magnetic core is used for combining RF signals. The second magnetic core is used to make the output impedance of the combiner equal to its input impedance (typically 75 Ω in cable television applications). In the absence of the second magnetic core, the output impedance of the combiner would be equal to one-half of its input impedance (i.e., in a cable television application, it would be 37.5 Ω). A splitter circuit also typically includes two magnetic cores. The first magnetic core is used for converting its input impedance to be equal to that of its output impedance (again, typically 75 Ω). The second magnetic core is used for actually splitting the input signal into two output signals. The RF circuitry is designed so that when a combiner is used as an input stage for a splitter, each of the aforementioned magnetic cores used for converting input/output impedances are eliminated. Elimination of these magnetic cores results in a reduction in signal loss. The RF circuitry is designed in such a way as to maximize the number of instances in which a combiner is used as an input stage for a splitter. Therefore, a maximum number of magnetic cores may be eliminated, meaning that a minimum number of magnetic cores are actually utilized.

Figure 1:
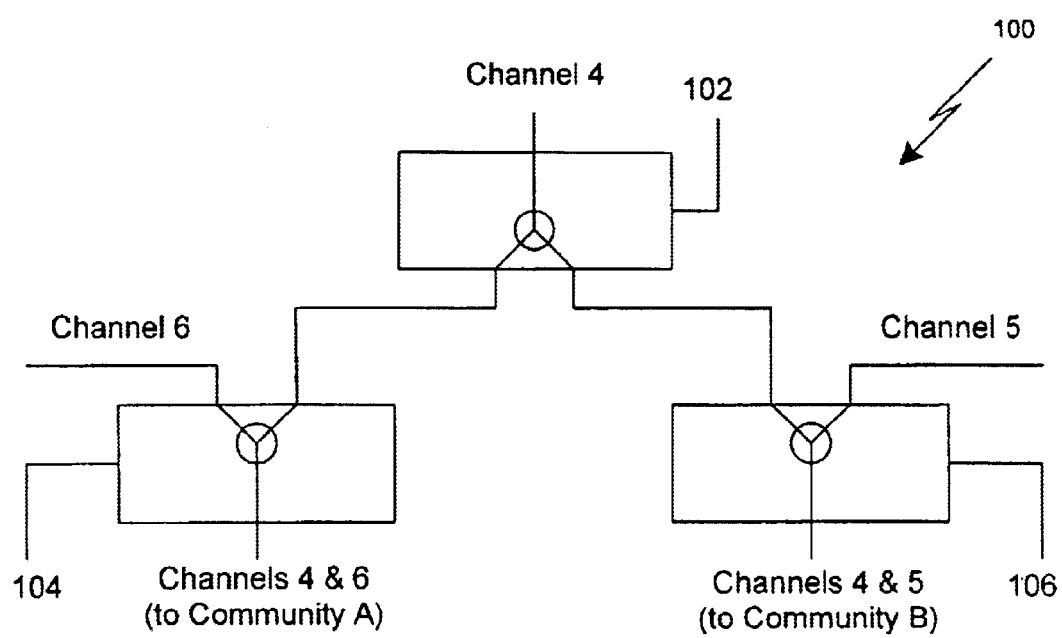
FIG. 1 depicts the functionality of a simple exemplary cable television routing station.
Figure 2:
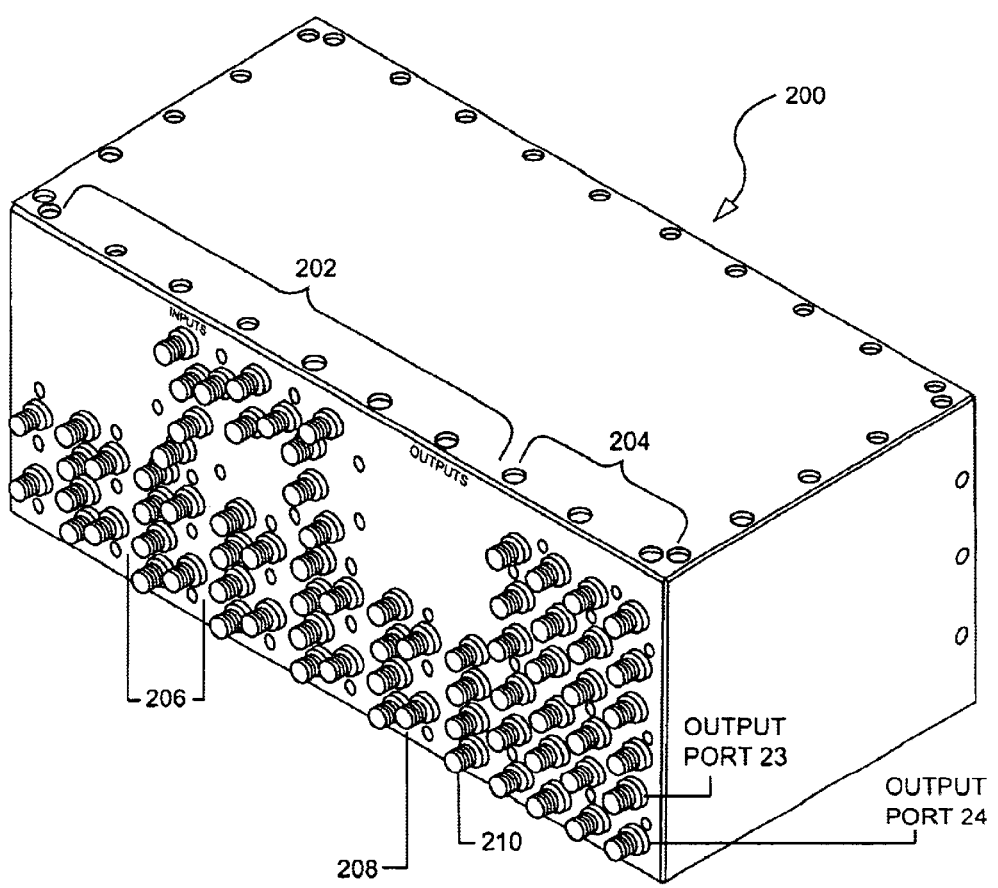
FIG. 2 depicts a 24 node insertion box, in accordance with an embodiment of the present invention.

FIG. 2 depicts an insertion box 200 having a plurality of input ports (collectively designated by reference numeral 202) and a plurality of output ports (collectively designated by reference numeral 204). The input and output ports 202 and 204 are shown as being coaxial, but may be in any form, in principle. Each input port 202 corresponds to a set of output ports 204. Thus, delivery of an RF signal into a particular input port 202 results in the RF signal being delivered from each of the corresponding output ports 204. The insertion box 200 houses RF circuitry (depicted in FIGS. 3 through 6) that is used for effecting the aforementioned correspondence between input and output ports. Although the insertion box 200 is depicted as having a particular number of input ports and output ports, an insertion box may have any number of input and output ports, in principle.

Each input port 202 has a label 206 associated with it. The labels 206 indicate the identity of the output ports 204 corresponding to an input port 202. Thus, a user may read the label 206 and know which output ports 204 a signal will be delivered to, if the signal is fed into a particular input port 202. For example, input port 208 is labeled "23–24," meaning that it is associated with output ports 23 and 24. Input port 210 is labeled "24," meaning that it is associated with output port 24. If a signal is fed to input port 208, it will be delivered from output ports 23 and 24. Similarly, if a signal is fed to input port 210, it will be delivered from output port 24. Thus, if signals were fed into both input ports 208 and 210, output port 24 would deliver both signals (the signal yielded from output port 24 would be frequency-spaced multiplexed, assuming the signals fed into input ports 208 and 210 were carried on different carrier frequencies).

FIG. 3 depicts an exemplary circuit schematic that may be housed in insertion box 200 to effect correspondence between input ports 202 and output ports 204. As can be seen from FIG. 3, a broadcast input is received by splitter 300. The broadcast input is to be delivered to all of the output ports (ports 1–24). Thus, the broadcast signal is delivered to combiners 302 and 304. At combiner 304, a signal to be delivered only to output ports 1–12 is combined with the broadcast signal. The resulting combined signal is fed to splitter 306.

The aforementioned partially stated structure of the circuit of FIG. 3, comports with a general scheme. A first signal that is to be output to a greatest number of ports is fed to a splitter (such as splitter 300). The resulting outputs are fed to combiners (such as combiners 302 and 304), which combine the aforementioned signal with a second signal intended to reach a number of output ports less than or equal to the number of ports intended to be reached by the first signal. Next, the combined signal is delivered to a splitter (such as splitter 306 or 308), and is then delivered to combiners (such as combiners 310, 312, 314, or 316), which combine the signals from the previous stage with other signals intended to reach a number of output ports less than or equal to the number of ports intended to be reached by the signal added during the previous stage. Accordingly, signals are alternately split and combined. After each stage of splitting, the signal is combined with another signal intended to reach a number of ports less than or equal to the number of ports intended to be reached by the previously split signal. Per this scheme, a first splitter is not used as an input stage for a second splitter, unless each path extending between the second splitter and the output lines (labeled 1–24) contains no combiners.

Figure 7:
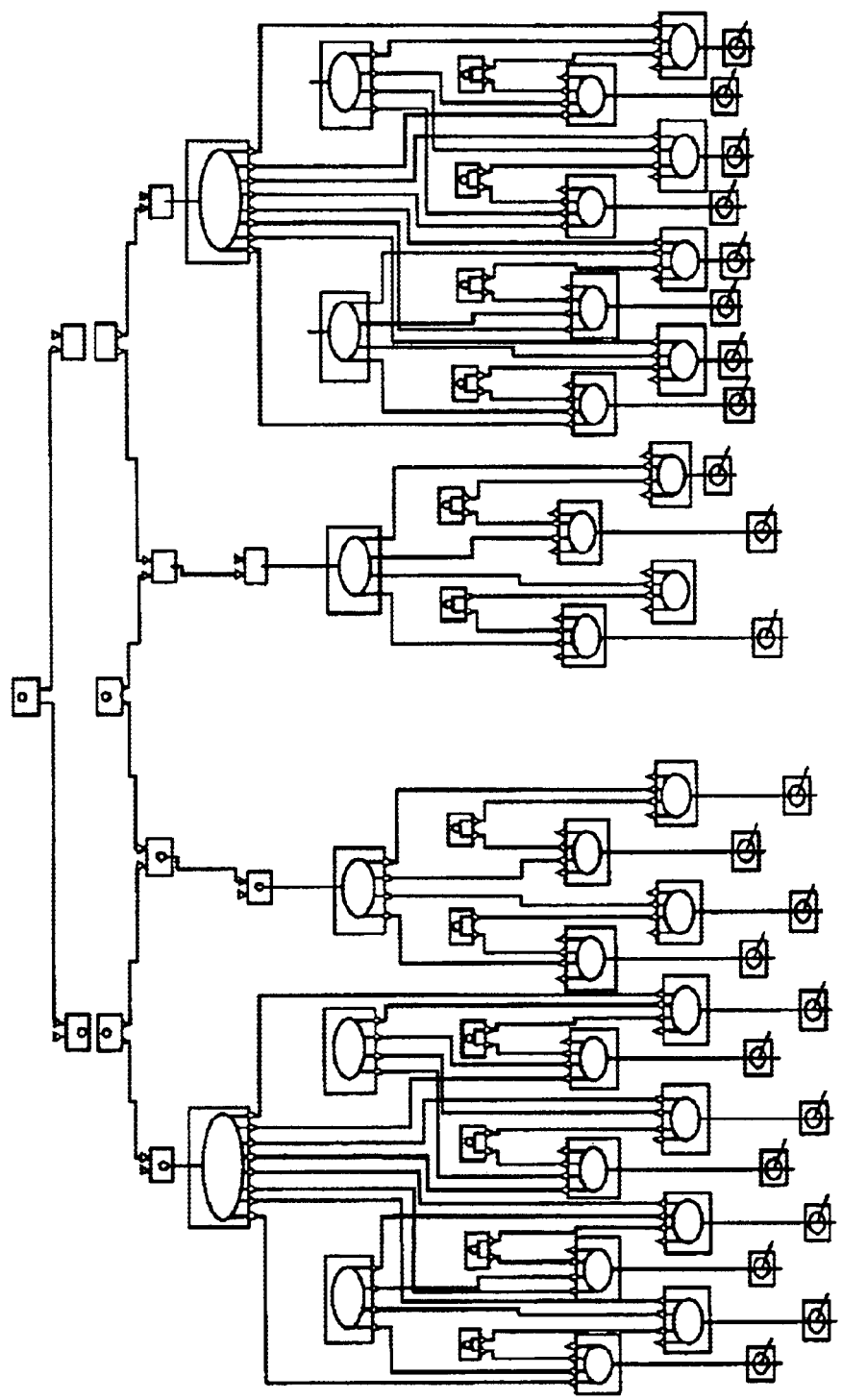
FIG. 7 depicts an exemplary circuit schematic that may be housed in an insertion box to effect correspondence between input ports and output ports.

An alternate circuit comporting with the above-described general scheme is depicted in FIG. 7.

Figure 4A:
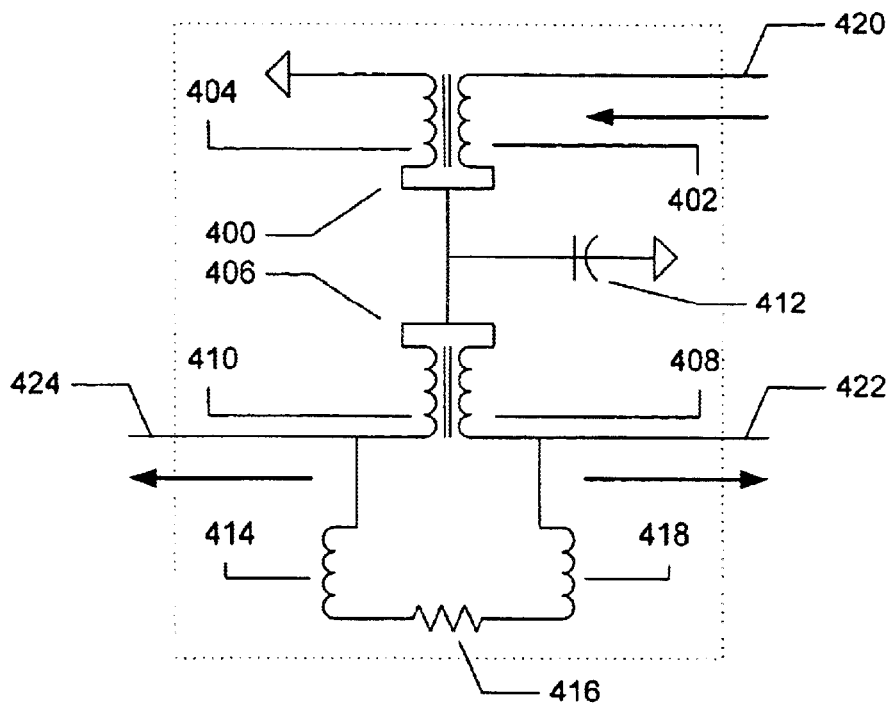
FIGS. 4A and 4B are schematics describing the circuitry used in certain splitters (FIG. 4A) and combiners (FIG. 4B) embedded in the circuit of FIG. 3.
Figure 4B:
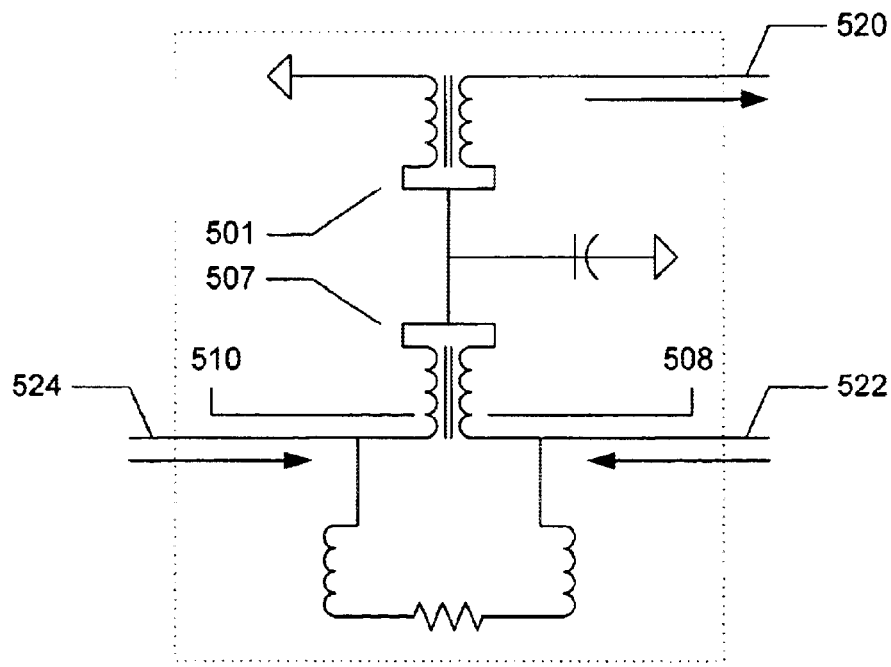

FIGS. 4A and 4B are schematics describing the circuitry used in certain splitters (FIG. 4A) and combiners (FIG. 4B) embedded in the circuit of FIG. 3. As can be seen from FIG. 4A, a signal to be split is conducted through a first winding 402 of a first transformer 400. A second winding 404 of the transformer 400 is grounded on one end and joined at its other end with the first winding 402. The signal to be split is conducted through the first winding 402, is joined with a replica signal induced on the second winding 404, and is conducted toward a second transformer 406. The second transformer 406 also has first and second windings 408 and 410. The first and second windings 408 and 410 are joined at the end receiving the signal conducted through the first transformer 400. The second transformer 406 splits the signal identically by virtue of mutual induction between the two windings 408 and 410, and the signal is conducted from the second end of each winding 408 and 410. Capacitor 412 may be included to compensate for tolerances in the first and second transformers 400 and 406. Inductors 414 and 418 and resistor 416 may be connected in series, joining the second end of each winding of the second transformer 406. Optionally, capacitors (not depicted) may be interposed, in series, between each inductor 414 and 418 and the resistor 416. This circuit structure improves isolation and return loss in low-frequency ranges. Such a circuit arrangement negates noise current generated on one output line 422 or 424 of the transformer 406 via induction through the second transformer 406.

If deployed in a cable television network, the input line 420 and output lines 422 and 424 would have a characteristic impedance of 75Ω. To achieve maximal power transfer from input line 420 to the splitter of FIG. 4A, the splitter must have an input impedance matching that of the input line— 75Ω. The first transformer 402 has a 2:1 impedance ratio to convert the input impedance of the splitter to 75Ω. If the first transformer 400 were to be removed from the circuit (i.e., if the input line 420 simply connected directly to the first end of second transformer 406), the input impedance of the splitter would be 37.5Ω, by virtue of the parallel arrangement of the two 75Ω output lines. However, the 2:1 impedance ratio on the first transformer 400 effectively scales up the otherwise 37.5Ω input impedance (the impedance "seen" on a primary winding of a transformer is equal to that which is on the secondary winding multiplied by the impedance ratio.) The output impedance of the splitter of FIG. 4A is 75Ω (thereby matching the impedance of the output lines 422 and 424), whether or not the first transformer 400 is included in the circuit.

As can be seen from FIG. 4B, signals to be combined are conducted through the second end of each winding 508 and 510 of a second transformer 507. The first ends of the windings 508 and 510 of the second transformer 507 are joined. Consequently, by virtue of mutual inductance, signals conducted along input lines 522 and 524 are combined into a single signal conducted from the first ends of the windings 508 and 510 of the second transformer 507. For the same reasons stated above, the combiner circuit depicted in FIG. 4B is required to possess the first transformer 501 (again, having a impedance ratio of 2:1), if the output impedance of the combiner is to match the characteristic impedance of the output line 520. Otherwise, the output impedance would be equal to one-half of the characteristic impedance of the input lines 522 and 524 (i.e., it would be 37.5Ω). The input impedance of the combiner depicted in FIG. 4B matches that of the input lines 524 and 522, whether or not the first transformer is included in the circuit.

Figure 5:
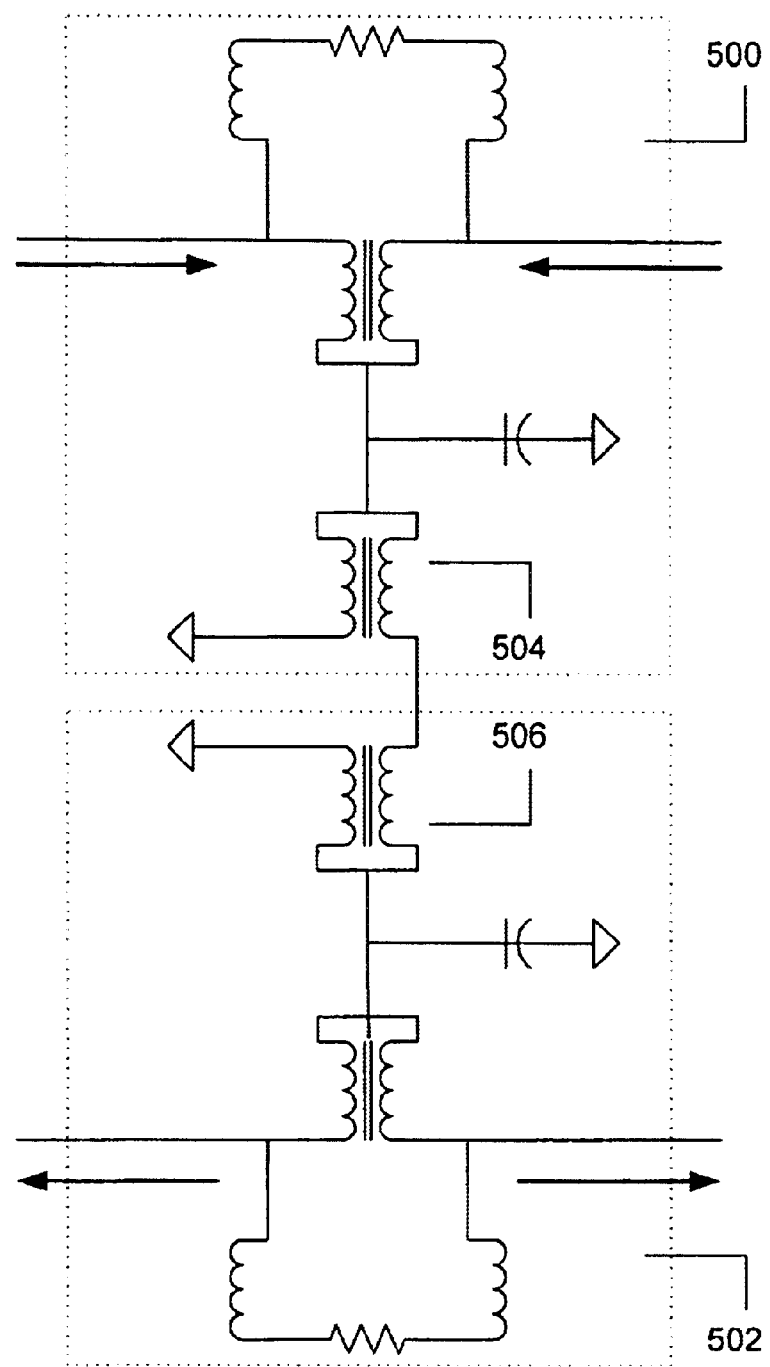
FIG. 5 depicts a typical circuit arrangement in which a combiner circuit is used as a preceding stage for a splitter.

FIG. 5 depicts a typical circuit arrangement in which a combiner circuit 500 is used as a preceding stage for a splitter 502. As can be clearly seen from FIG. 5, the circuit therein is simply a combination of the circuits depicted in FIGs. 4A (splitter 502) and 4B (combiner 500).

The circuit of FIG. 5 unnecessarily introduces loss. To understand why this is the case, one must examine the input and output impedances of the splitter 502 and combiner 500, assuming that transformers 504 and 506 are absent. As described in the discussion associated with FIG. 4B, in the context of a cable television network, the output impedance of a combiner would be 37.5Ω, absent transformer 504. As described in the discussion associated with FIG. 4A, the input impedance of splitter 502, absent transformer 506, is 37.5Ω. Thus, even without transformers 504 and 506, the output impedance of the combiner 500 matches the input impedance of the splitter 502, meaning that maximal power transfer from combiner 500 to splitter 502 occurs. Notably, in accordance with the discussion associated with FIGs. 4A and 4B, described above, the input impedance of combiner 500 is 75Ω, as is the output impedance of splitter 502.

Figure 6:
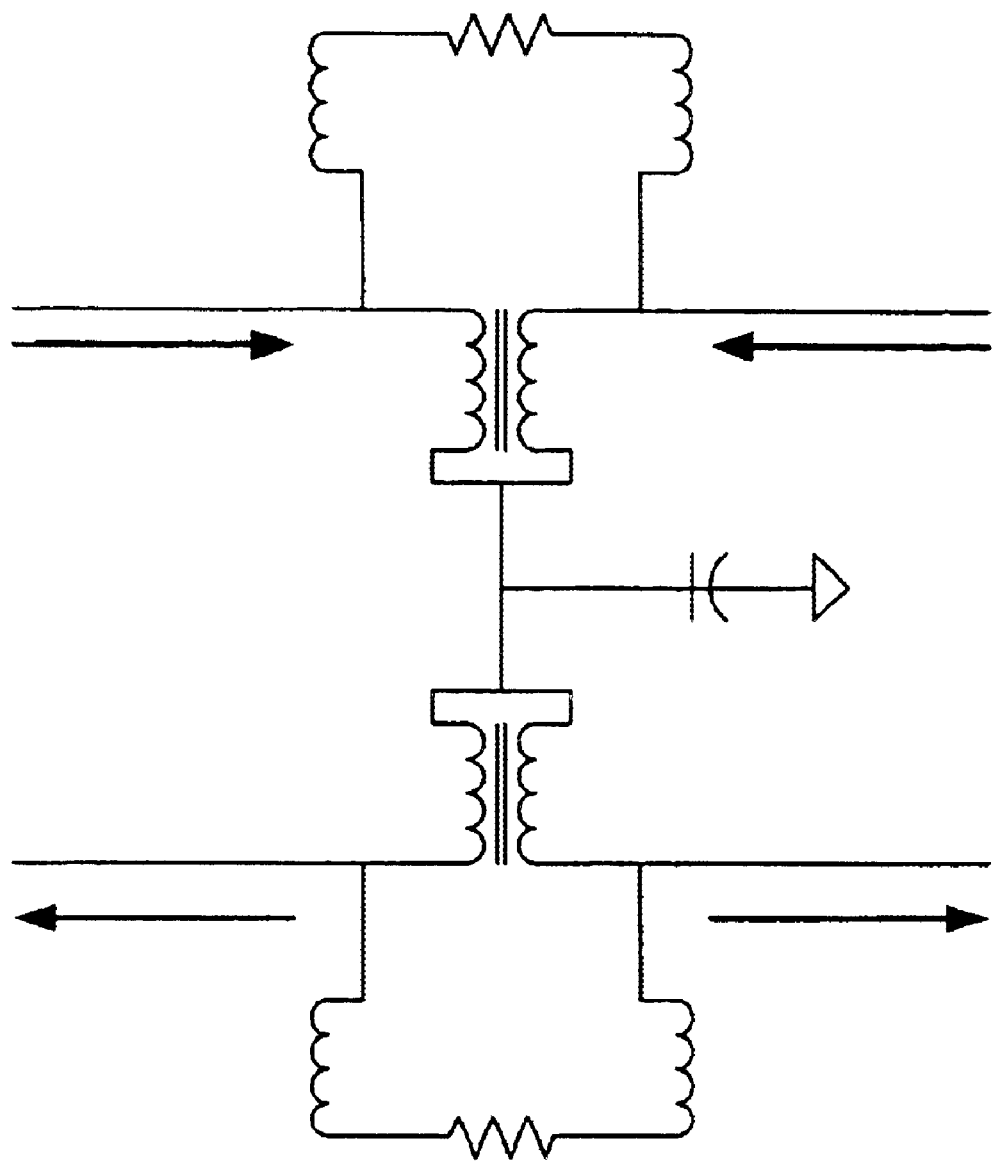
FIG. 6 depicts an embodiment of a circuit arrangement in which a combiner circuit is used as a preceding stage for a splitter circuit, in accordance with the present invention.

It has been common practice to ensure that input and output impedance of every splitter and combiner circuit is 75Ω. This ensures that any splitter or combiner circuit can be interconnected with any other splitter or combiner circuit, while maintaining maximal power transfer. It also ensures that any splitter or combiner circuit can interface with a coaxial cable having a characteristic impedance of 75Ω, while maintaining maximal power transfer. However, in the context of an insertion box 200, such as shown in FIG. 2, this is unnecessary. The insertion box 200 of FIG. 2 utilizes known, unchanging interconnections between splitters and combiners, in order to effect the correspondence between inputs and outputs described by the labeling 206 on the front cover of the box 200. Thus, under these circumstances, the designer of the RF circuitry intended to effect such correspondence is able to know that a particular combiner is to be used as a preceding stage for a particular splitter. When this occurs, transformers 504 and 506 may be eliminated (meaning that the loss introduced by those transformers can also be eliminated). The resulting circuit is depicted in FIG. 6.

As described with reference to FIG. 3, the general methodology regarding alternately combining and splitting signals is intended to maximize the occurrence of combiners being used as preceding stages to splitters. Consequently, a maximal number of transformers are eliminated, and a maximal amount of loss is also eliminated. FIG. 3 identifies four instances in which the circuit of FIG. 6 may be employed (these instances are identified by dotted lines encircling combiners used as a preceding stage for a splitter).

The various embodiments described above are provided by way of illustration only and should not be construed to limit the invention. Those skilled in the art will readily recognize various modifications and changes which may be made to the present invention without strictly following the exemplary embodiments and applications illustrated and described herein and without departing from the true spirit and scope of the present invention which is set forth in the following claims.

The claimed invention is:

1. An insertion box comprising:
   a plurality of output ports, each output port being coupled to an output line, each output line exhibiting a characteristic impedance;
   a plurality of input ports, each input port being coupled to an input line, each input line exhibiting the characteristic impedance,
   wherein each input port corresponds with a predefined and unchanging set of output ports, so that a radio frequency (RF) signal conducted to a particular input port is conducted from the corresponding set of output ports,
   wherein an RF circuit is interposed between the input ports and the output ports, the RF circuit effecting said correspondence between input ports and output ports,
   wherein the RF circuit comprises splitter circuits and combiner circuits,
   wherein at least one splitter circuit exhibits an input impedance less than the characteristic impedance, and
   wherein at least one combiner circuit exhibits an output impedance less than the characteristic impedance.

2. The insertion box of claim 1, wherein the combiner exhibiting an output impedance less than the characteristic impedance is connected to an input of the splitter circuit exhibiting an input impedance less than the characteristic impedance.

3. The insertion box of claim 1, wherein at least one splitter circuit exhibits an input impedance that is one-half of the characteristic impedance, and at least one combiner circuit exhibits an output impedance that is one-half of the characteristic impedance.

4. The insertion box of claim 3, wherein the combiner exhibiting an output impedance that is one-half of the characteristic impedance is connected to an input of the splitter circuit exhibiting an input impedance that is one-half of the characteristic impedance, thereby creating a combiner-splitter pair.

5. The insertion box of claim 3, wherein the characteristic impedance is approximately 75Ω.

6. The insertion box of claim 4, wherein the combiner exhibiting an output impedance that is one-half of the characteristic impedance excludes a transformer having an impedance ratio of 2:1.

7. The insertion box of claim 4, wherein the splitter exhibiting an input impedance that is one-half of the characteristic impedance excludes a transformer having an impedance ratio of 2:1.

8. An RF circuit comprising a combiner-splitter pair, the combiner-splitter pair comprising:
   a first transformer having a first winding and a second winding, each winding having an input end and an output end, wherein the output ends of the first and second windings are joined, creating a combiner output;
   a second transformer having a third winding and a fourth winding, each winding having an input end and an output end, wherein the input ends of the third and fourth windings are joined, creating a splitter input, and
   wherein the splitter input is attached to the combiner output.

9. The RF circuit of claim 8, wherein the first transformer has a 1:1 winding ratio.

10. The RF circuit of claim 9, wherein the second transformer has a 1:1 winding ratio.

11. The RF circuit of claim 8, further comprising a capacitor between the combiner output and ground.

12. The RF circuit of claim 8, further comprising:
    a first inductor, in series with a resistor, in series with a second inductor, interposed between the input ends of the first and second windings.

13. The RF circuit of claim 8, further comprising:
    a first inductor, in series with a resistor, in series with a second inductor, interposed between the output ends of the third and fourth windings.

14. A method of disseminating a plurality of RF signals from a plurality of input lines to a plurality of output lines, the method comprising:
    receiving, from one of the plurality of input lines, a first signal and splitting the first signal along first and second conduction paths;
    receiving the signal propagating along the first conduction path and combining it with a second signal, using a combiner exhibiting an output impedance that is one-half of its input impedance;
    splitting the combined signal, using a splitter exhibiting an output impedance that is twice its input impedance; and
    disseminating the split output signal to a plurality of output lines.

15. The method of claim 14, further comprising:
    receiving the split output and combining it with a third signal.

16. The method of claim 14, wherein the first signal is a signal that is to be disseminated to a greatest number of output lines.

17. The method of claim 16, wherein the second signal is a signal that is to be disseminated to a second-greatest number of output lines.

18. An insertion box comprising:
    a plurality of output ports, each output port being coupled to an output line, each output line exhibiting a characteristic impedance;

a plurality of input ports, each input port being coupled to an input line, each input line exhibiting the characteristic impedance, wherein each input port corresponds with a set of output ports, so that a radio frequency (RF) signal conducted to a particular input port is conducted from the corresponding set of output ports, wherein an RF circuit is interposed between the input ports and the output ports, the RF circuit effecting said correspondence between input ports and output ports, wherein the RF circuit comprises a means for combining and splitting RF signals without using a magnetic core to convert an output impedance of the means for combining to match an input impedance of the means for splitting.

19. The insertion box of claim 18, wherein the means for combining is connected to an input to the means for splitting.

20. The insertion box of claim 18, wherein an input impedance of the means for combining is twice its output impedance.

21. The insertion box of claim 20, wherein an output impedance of the means for splitting is twice its input impedance.

22. A method of disseminating a plurality of RF signals from a plurality of input lines to a plurality of output lines, the method comprising:

receiving, from one of the plurality of input lines, a first signal intended to be disseminated to a first number of output lines, and splitting the first signal along first and second conduction paths;

receiving the first signal as it propagates along the first conduction path and combining it with a second signal intended to be disseminated to a second number of output lines, wherein the second number of output lines is less than the first number of output lines; and receiving the first signal as it propagates along the second conduction path and combining it with a third signal intended to be disseminated to a third number of output lines, wherein the third number of output lines is less than the first number of output lines.

23. The method of claim 22, further comprising:

receiving the combined first and second signals, and splitting the combined first and second signals along third and fourth conduction paths;

receiving the combined first and second signals as they propagate along the third conduction path, and combining them with a fourth signal intended to reach a fourth number of output lines, wherein the fourth number of output lines is less than the second number of output lines;

receiving the combined first and third signals, and splitting the combined first and third signals along fifth and sixth conduction paths;

receiving the combined first and third signals as they propagate along the fifth conduction path, and combining them with a fifth signal intended to reach a fifth number of output lines, wherein the fifth number of output lines is less than the third number of output lines.

24. An RF circuit for disseminating a plurality of RF signals from a plurality of input lines to a plurality of output lines, the circuit comprising:

a plurality of interconnected splitters and combiners defining a plurality of paths between the input lines and the output lines, wherein at least one of the plurality of paths includes at least two splitters and at least two combiners, wherein a first splitter is not used as an input stage for a second splitter, unless each path extending between the second splitter and the output lines contains no combiners.

* * * * *